(12) United States Patent
Chittipeddi et al.

(10) Patent No.: US 6,187,658 B1
(45) Date of Patent: Feb. 13, 2001

(54) BOND PAD FOR A FLIP CHIP PACKAGE, AND METHOD OF FORMING THE SAME

(75) Inventors: Sailesh Chittipeddi, Allentown, PA (US); Vivian Ryan, Washington, NJ (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/503,814

(22) Filed: Feb. 15, 2000

Related U.S. Application Data

(62) Division of application No. 09/162,247, filed on Sep. 28, 1998, now Pat. No. 6,087,732.

(51) Int. Cl.[7] .................................................. H01L 21/44
(52) U.S. Cl. ..................... 438/612; 438/614; 438/652; 438/666
(58) Field of Search ............................. 438/613, 614, 438/652, 653, 656, 666, 612

(56) References Cited

U.S. PATENT DOCUMENTS

| | | | |
|---|---|---|---|
| 5,053,850 | 10/1991 | Baker et al. | 357/68 |
| 5,220,199 | 6/1993 | Owada et al. | 257/773 |
| 5,426,266 | 6/1995 | Brown et al. | 174/267 |
| 5,739,587 | 4/1998 | Sato | 257/758 |
| 5,751,065 | 5/1998 | Chittipeddi et al. | 257/758 |
| 5,929,521 | * 7/1999 | Wark et al. | 257/737 |
| 5,962,921 | * 10/1999 | Farnworth et al. | 257/773 |
| 5,996,343 | * 11/1999 | Chittipeddi et al. | 257/758 |

FOREIGN PATENT DOCUMENTS 08-111544   4/1996   (JP).

* cited by examiner

*Primary Examiner*—Kevin M. Picardat
(74) *Attorney, Agent, or Firm*—Duane Morris & Heckscher LLP; Steven E. Koffs

(57) ABSTRACT

A bond pad support structure is located beneath a bond pad on an integrated circuit. The bond pad support structure includes a first bond pad support layer at least partly located below the bond pad. The first bond pad support layer has a plurality of radial patterns with at least one space between the radial patterns. The radial patterns may be, for example, straight lines having approximately uniform thickness. Alternatively, the radial patterns may be triangles, each of which has an apex pointing to the center of a region below the bond pad. The radial patterns may have a plurality of different lengths. A second bond pad support layer is located on the first bond pad support layer. The second bond pad support layer fills at least a portion of the space between the radial patterns.

8 Claims, 3 Drawing Sheets

BOND PAD FOR A FLIP CHIP PACKAGE, AND METHOD OF FORMING THE SAME

This application is a divisional of U.S. application Ser. No. 09/162,247, filed on Sep. 28, 1998, U.S. Pat. No. 6,087,732.

FIELD OF THE INVENTION

The present invention relates to very large scale integrated (VLSI) circuit packaging techniques and structures.

DESCRIPTION OF THE RELATED ART

The flip chip package is the most space efficient package for very large scale integrated (VLSI) circuits. In a flip chip package, an integrated circuit (IC) device has a plurality of bond pads distributed over the face of the device in a rectangular array. These bond pads are used to connect the IC device to the electrical paths on a printed circuit board (PCB). A solder bump or ball is formed on each of the bond pads of the IC device. The IC device and the PCB are positioned so that the solder bumps or balls contact the electrical paths on the PCB, and the assembly is heated to reflow the solder, forming electrical and mechanical bonds between the IC device and the PCB.

During use, the bond pads of the flip chip package are subjected to thermally induced shear stresses far in excess of those encountered by devices formed by other bonding techniques, such as wire bonding. In the flip chip package, the metal of the bond pads is subjected to compressive forces when the IC device dissipates power in the form of heat. The metal in the bond pads may be extruded upward plastically, to form bumps. When the IC device is subsequently cooled, the metal is stressed, which may cause a delamination type failure.

As thinner line widths (for example, between 0.12 and 0.16 $\mu$m) are incorporated into the IC designs, dielectric materials (surrounding metal conductors on the device) having low dielectric constants (typically less than 3.0) are used to increase speed without introducing cross-talk between the circuit paths in the device. Materials having the desired low dielectric constants tend to be mechanically weaker than materials having higher dielectric constants, increasing the likelihood of failure due to shear stress between the bond pads and the solder connections.

In the prior art, (wire bonded) devices greater than 0.3 $\mu$m have been constructed beneath the electrode bond pads, by depositing a solid metal cushion pad in the metal layer below the bond pads.

A structure and method are desired for reducing the likelihood of failure in VLSI devices during bonding and thermal cycling is desired.

SUMMARY OF THE INVENTION

The present invention is a bond pad support structure located beneath a bond pad on an integrated circuit, including a first bond pad support layer at least partly located below the bond pad, the first bond pad support layer having a plurality of radial patterns with at least one space between the radial patterns; and a second bond pad support layer located on the first bond pad support layer and filling at least a portion of the space.

A method of forming a bond pad support structure in an integrated circuit having a bond pad, includes the steps of: forming a first bond pad support layer at least partly located below the bond pad, the first bond pad support layer comprising a plurality of radial patterns with at least one space therebetween; and forming a second bond pad support layer on the first bond pad support layer, so that the second bond pad support layer fills at least a portion of the space.

DETAILED DESCRIPTION

Figure 1:
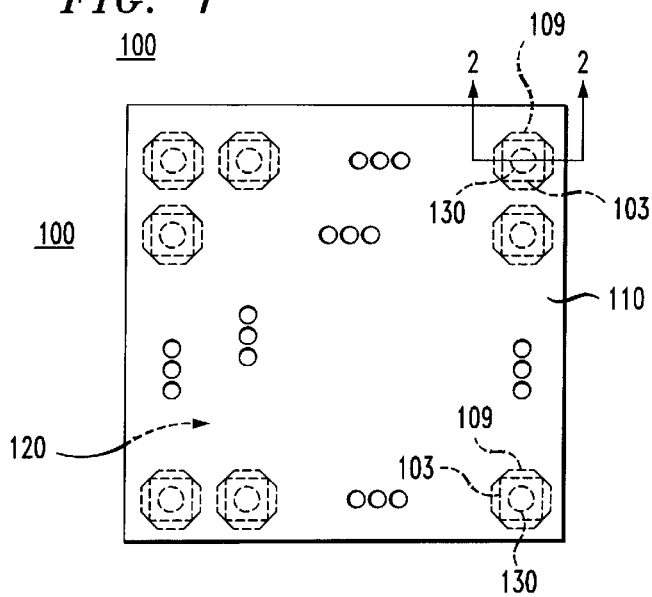
FIG. 1 is a top plan view of a PCB having a plurality of devices with bond pad support structures according to the present invention. The ellipses (ooo) represent additional identical bond pad support structures.
Figure 2:
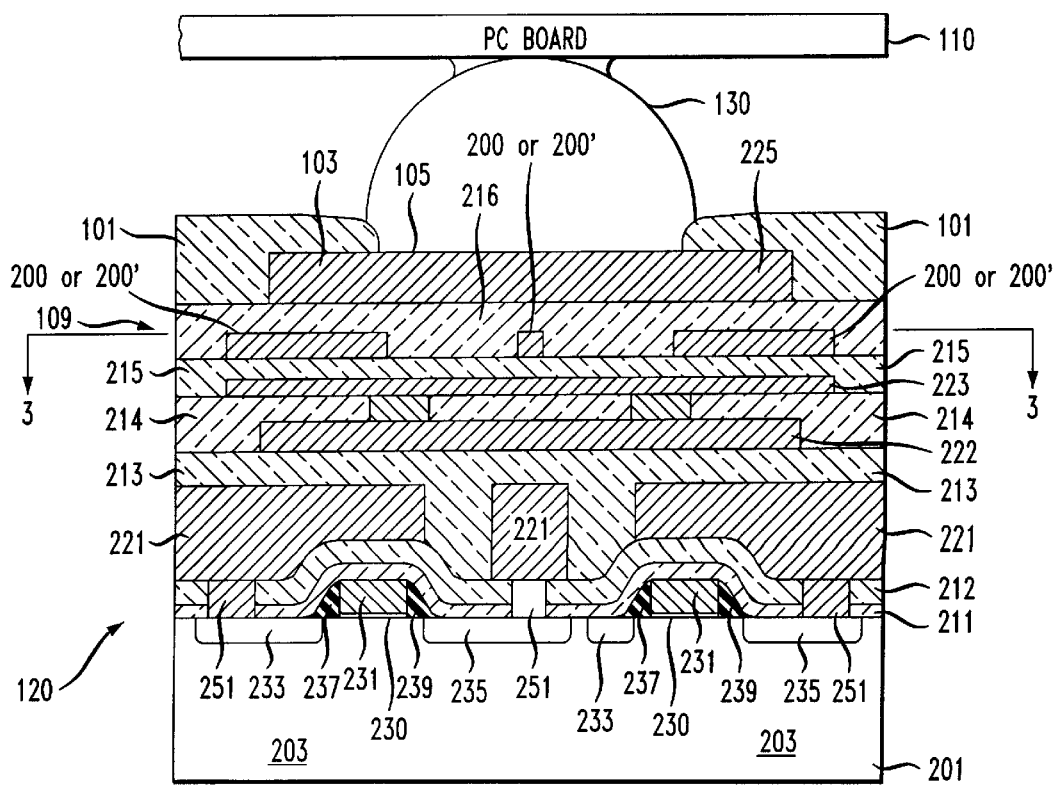
FIG. 2 is a cross-sectional view taken along section line 2—2 of FIG. 1, showing a bond pad support structure and one of the devices shown in FIG. 1.
Figure 3:
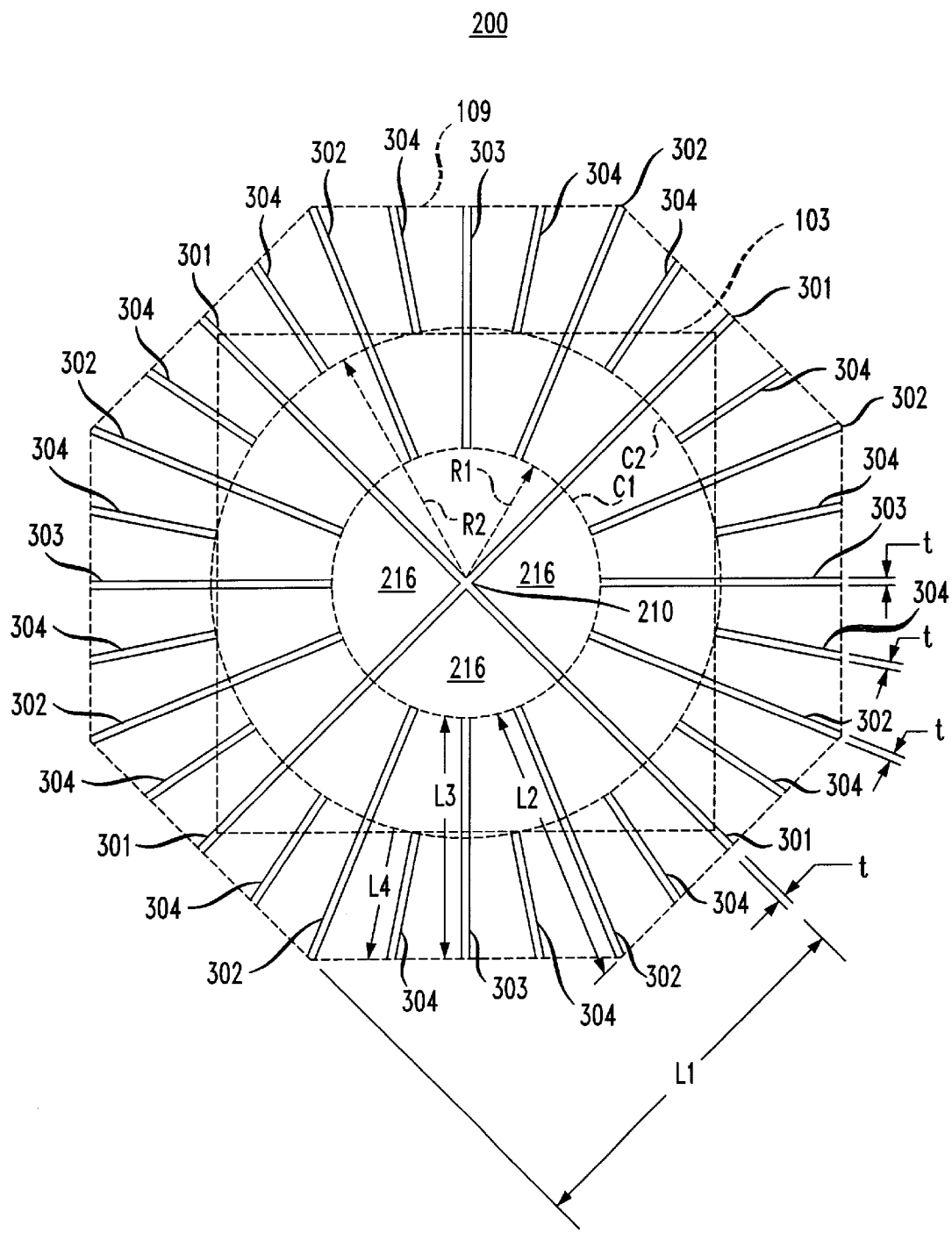
FIG. 3 is a cross-sectional view taken along section line 3—3 of FIG. 2, showing a first exemplary bond pad support structure according to the present invention.

The present invention is a bond pad support structure 109 and a method for forming the bond pad support structure. FIGS. 1–3 show an example of the structure. The bond pad support structure 109 is located beneath a bond pad 103 on an integrated circuit 120. The structure includes a first bond pad support layer, referred to generally by reference numeral 200. The first bond pad support layer 200 is at least partly located below the bond pad 103. The first bond pad support layer 200 has a plurality of radial patterns 301–304 (best seen in FIG. 3) with at least one space between the radial patterns. A second bond pad support layer 216 is located on the first bond pad support layer 200 and fills at least a portion of the space.

FIG. 1 is a top plan view of an assembly 100 including a PCB 110 including a flip chip package 120 bonded thereon. As referred to herein, the terms "top" and "above" refer to the direction towards the PCB 110, as shown in FIG. 2, and the terms, "bottom" and "below" refer to the direction of the substrate 201. FIG. 2 is a cross-sectional view taken along section line 2—2 of FIG. 1. One of ordinary skill in the art understands that the configuration shown in FIG. 2 is a flip chip configuration.

As shown in FIG. 1, assembly 100 includes a plurality of electrode pads 103. Each electrode pad 103 corresponds to an electrode of a semiconductor device 203 (shown in FIG. 2). The electrical connections between the devices 203 and the wirings (not shown) of the PCB 110 are formed by way of the plurality of electrode pads 103. Each electrode pad 103 has a respective solder ball or bump 130 formed thereon. Also shown in FIG. 1 is an electrode support structure 109 which lies beneath each respective electrode pad 103. The ellipses (ooo) in FIG. 1 represent additional bond pads 103, bond pad support structures 109 and solder balls or bumps 130.

One of ordinary skill in the art understands that each bond pad 103 represented by the ellipses in FIG. 1 may have a respective support structure 109, which may be identical to the bond pad support structures 109 shown in FIG. 1.

FIG. 2 shows a detailed cross sectional view of a single solder connection 130 between the PCB 110 and the IC devices 203. Devices 203 are only shown to present one example. A variety of different types of semiconductor devices may be included in the assembly 100. These devices are known to one of ordinary skill in the design of semiconductor devices, and are not described in detail herein.

The semiconductor devices 203 are now briefly described. The exemplary devices 203 are field effect transistors (FETs). A substrate 201 may be of a conventional semiconductor technology, such as silicon, gallium arsenide, or the like, and may be doped with positive or negative charge carriers therein. Source and Drain diffusion regions 233 and 235 for each device 203 are formed in the surface of the substrate 201. Gate conductors 231 and gate isolation regions 237 and 239 are formed adjacent each gate conductor 231, above and between each set of source and drain diffusion regions 233 and 235.

Additional layers include: a first dielectric layer 211 and a second dielectric layer 212 formed on the substrate. Then a first metal layer 221, a third dielectric layer 213, a second metal layer 222, a fourth dielectric layer 214, a third metal layer 223, a fifth 20 dielectric layer 215, a fourth metal layer 200 (or 200'), a sixth dielectric layer 216, a fifth metal layer 225, and a seventh dielectric layer 101. The seventh dielectric layer 101 is patterned to expose portions 105 of a plurality of metal bond pads 103. The exposed portion of the bond pad layer 105 is the portion of the fifth metal layer 225, which interfaces with solder bump 130.

Figure 4:
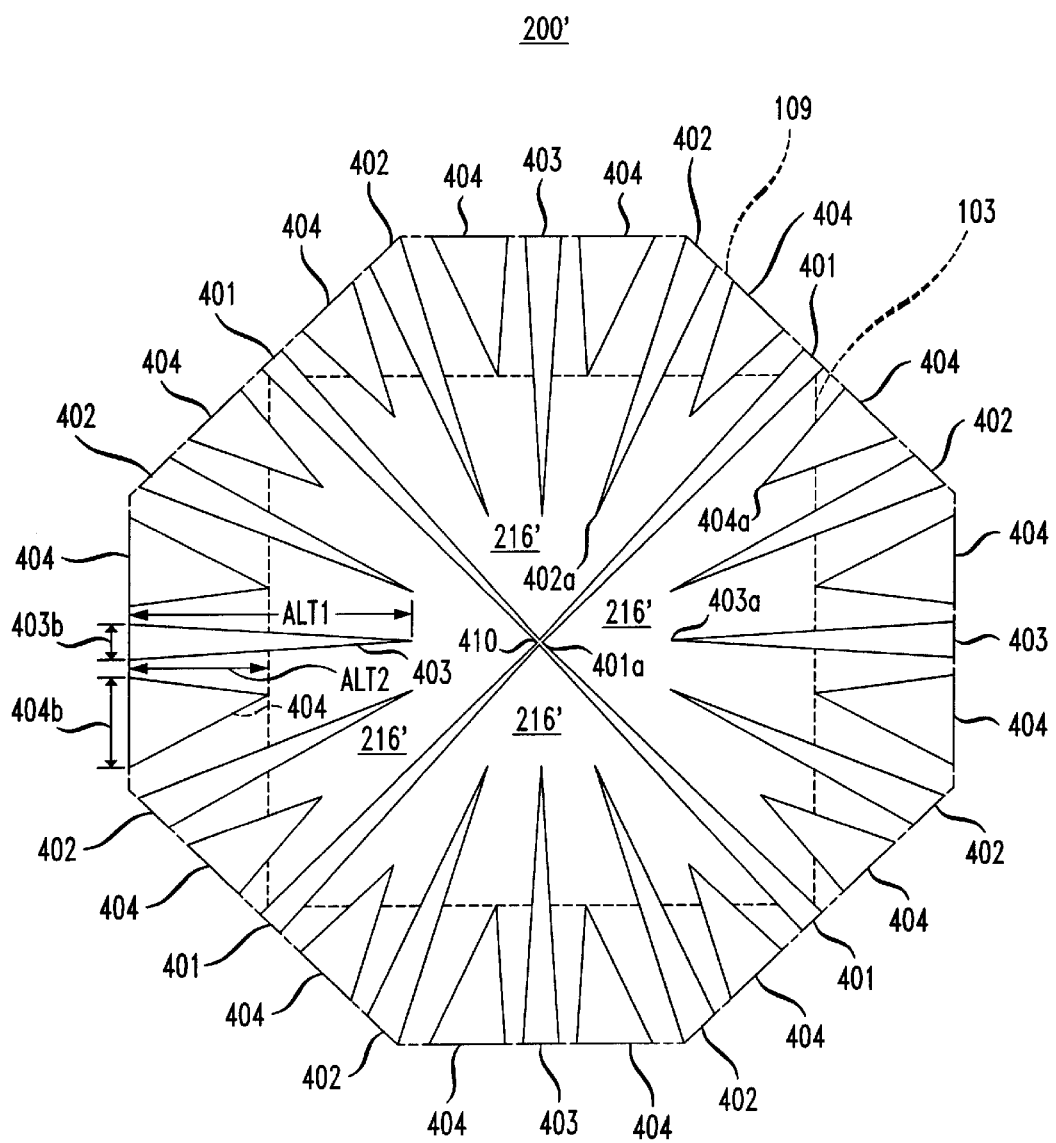
FIG. 4 is an alternative cross-sectional view taken along section line 3—3 of FIG. 2, showing a second exemplary bond pad support structure according to the present invention.

Dielectric layers 211 and 212 have windows 251 which provide electrical connections between the substrate 201 and metal layer 221. The metal layer 200 nearest the bond pad 103 provides stress relief during the bonding process and, more importantly, during thermal cycling in use throughout product life. The fourth metal layer 200 (or 200') comprises a plurality of metal lines or elongated polygons formed beneath the bond pad, as best seen in FIGS. 3 and 4. The region beneath the bond pad may thus be used for active circuitry with reduced risk of damage to the dielectric layers beneath the bond pads 103. Although the exemplary structure includes five metal layers, fewer or more numerous metal layers may be used.

The gate conductor 231 may be formed of polycrystalline silicon. A conventional gate oxide insulation layer 230 separates the gate 231 from the substrate 203. The first and second dielectric layers 211 and 212 may be conformal dielectrics such as tetraethylorthosilicate (TEOS) and borophosphotetraethylorthosilicate (BPTEOS), respectively. Other dielectric layers may be formed from known oxide or nitride materials. The metal layers may be aluminum or other conductive metals suitable for use in semiconductor devices. Additives, such as silicon, may be present in minor amounts.

The metal conductors may be formed using more than one deposition of different films, such as titanium nitride, titanium and aluminum.

The above described structures may be formed using conventional techniques 15" known to those of ordinary skill in the art of semiconductor fabrication processes. For example, conventional lithographic, ion implantation, etching, etc. processes may be used. In particular, in an exemplary process for forming the bond pad support structure described herein, chemical vapor deposition (CVD) is used to form the patterns in the first bond pad support layer 200, using aluminum as the metal.

FIG. 3 shows a first exemplary bond pad support structure 109 according to the invention. The bond pad support structure 109 has a first bond pad support layer 200, including a plurality of radial patterns 301–304 with spaces in between. A second bond pad support layer 216 partly extends into the spaces, so that there is no void in layer 200.

The radial patterns 301–304 have a plurality of lengths. A locus of outermost points of each of the plurality of patterns 301–304 lie along a polygon having at least four sides. The polygon forms the outer boundary of the bond pad support structure 109. In the example, the polygon is an octagon, but the polygon may alternatively be a rectangle, pentagon, hexagon, or other polygon. Alternatively, circular, elliptical, or oval pattern may also be used. The exemplary octagon will be referred to herein by the reference numeral 109, which is the reference numeral of the bond pad support structure. The exemplary polygon 109 is larger than the bond pad 103, so that the radial patterns extend past the edge of the bond pad 103.

The radial patterns may be divided into sets of patterns, such that each pattern in a given set has a common length with the other patterns in the same set. A first set has the longest patterns 301 of length L1. Second, third and fourth sets have patterns 302, 303 and 304, with respective lengths L2, L3 and L4. In the example, $$L1 > L2 > L3 > L4$$

The lengths L2 and L3 differ only slightly; both structures 302 and 303 have inner points lying on the same circle C1. The outer ends of patterns 302 lie in the corners of the octagon 109, whereas patterns 303 are perpendicular to the sides of polygon 109. The innermost points 301a–304a of the patterns 301–304 lie along a plurality of concentric circles. For example, the innermost points 302a and 303a of respective patterns 302 and 303 lie along a first circle C1 with an inner radius R1, and the innermost points 304a of patterns 304 lie on a second circle C2 having a radius R larger radius than the radius R1 of the first circle C1. C1 and C2 may alternatively be elliptical or oval patterns having the same center point 210.

Because all of the patterns 301–304 have an end lying on the polygon 109, the patterns in the shorter sets of patterns begin at a radius that is further from a point 210 beneath the center of the bond pad 103 than the patterns in a set of longer patterns. Patterns 301 begin at the center. Patterns 302 and 303 begin at the smallest non-zero radius. Patterns 304 begin furthest from the center. For example, the patterns 304 in the shorter sets of patterns begin at a radius R2 that is further from a point 210 beneath the center of the bond pad 103 than the patterns 302 in a set of longer patterns. Thus, patterns 301 begin at the center.

In general, the patterns 301–304 are positioned so that the distance between a point on a first pattern and the nearest point on an adjacent pattern is of the same order of magnitude. Thus, the patterns that are shorter include a larger number of members than the patterns that are longer. For example, there are more of patterns 304 than there are of patterns 302 and 303 combined.

Although the example shows radial patterns 301–304 of four different sizes L1, L2, L3 and L4, any number of different pattern sizes may be used.

In the example of FIG. 3, each of the patterns 301–304 is a line segment having about the same width t as each of the other line segments. In one example, the bond pad is about 100 $\mu$m square, and the line thickness t is about 0.5 $\mu$m. One of ordinary skill in the art recognizes that the invention may be used with bond pads of other sizes, and the patterns may alternatively increase in thickness as the distance from a point beneath the center of the bond pad 103 increases.

The second bond pad support layer 216 may be formed of either a dielectric material or a metal. In the example, a dielectric material is used. In the example, layer 216 is a dielectric.

FIG. 4 shows a second example of a pattern for a bond pad support layer 200' according to the invention. Bond pad support layer 200' may be used in the same location and structure described above with reference to FIG. 2.

The first bond pad support layer 200' is at least partly located below the bond pad 103. The first bond pad support layer 200' has a plurality of radial patterns 401–404 (best seen in FIG. 4) with at least one space between the radial patterns. A second bond pad 20 support layer 216' is located on the first bond pad support layer 200' and fills at least a portion of the space.

In bond pad support layer 200', each of the patterns 401–404 is a triangle. Each of the triangles 401–404 has an apex 401a–404a that points towards a position 410 beneath the center of the bond pad 103. Thus, the amount of material in a differential band between a pair of radii spaced apart by a given length increases as the two radii increase.

The patterns 401–404 share many features with the first exemplary embodiment of the invention shown in FIG. 3.

The radial patterns 401–404 have a plurality of lengths. A locus of outermost points of each of the plurality of patterns 401–404 lie along a polygon having at least four sides. The polygon forms the outer boundary of the bond pad support structure 109. In the second example, the polygon is also an octagon, but the polygon may alternatively be a rectangle, pentagon, hexagon, or other polygon. A circular, elliptical, or oval pattern may also be used.

The radial patterns 401–404 may be divided into sets of patterns, such that each pattern in a given set has a common length with the other patterns in the same set. A first set has the longest patterns 401 of length L1. Second, third and fourth sets have patterns 402,403 and 404, with respective lengths L2, L3 and L4. These lengths may be the same as the lengths L1–L4 shown in FIG. 3, or may vary.

The lengths L2 and L3 differ only slightly; both structures 402 and 403 have inner points lying on the same circle. The outer ends of patterns 402 lie in the corners of the octagon 109, whereas patterns 403 are perpendicular to the sides of polygon 109. The innermost points 401a–404a of the patterns 401–404 lie along a plurality of concentric circles (not shown in FIG. 4). For example, the innermost points 402a and 403a of respective patterns 402 and 403 lie along a first circle (not shown in FIG. 4), and the innermost points 404a of patterns 404 lie on a second circle (not shown in FIG. 4) having a larger radius than the first circle.

Because all of the patterns 401–404 have an end lying on the polygon 109, the patterns in the shorter sets of patterns begin at a radius that is further from a point 410 beneath the center of the bond pad than the patterns in a longer set of patterns. For example, patterns 401 begin at the center. Patterns 402 and 403 begin at the smallest non-zero radius. Patterns 404 begin furthest from the center.

Support layer 200' also has unique features which differ from the pattern 200 shown in FIG. 3. In bond pad support layer 200', the plurality of triangles include: a first set of triangles 401–403 having an apex 401a–403a which lies within a region beneath the bond paid 103; and a second set of triangles 404 lying substantially outside of the region beneath the bond pad 103.

In FIG. 4, the plurality of triangles include: a first set of triangles 403 having a first altitude ALT1 and a first base dimension 403b; and a second set of triangles 404 having a second altitude ALT2 shorter than the first altitude ALT1 and a second base dimension 404b wider than the first base dimension 403b. Similar relationships exist between the altitudes and bases of triangles 401 relative to triangles 402, 403 and 404. Similar relationships exist between the altitudes and bases of triangles 402 and 404.

Using a bond pad support structure according to the invention, bonding and thermal cycling stresses within an IC device may be buffered and diffused.

One of ordinary skill in the art understands that the choice of whether to use the patterns 200 of FIG. 3 or the patterns 200' or FIG. 4 in any given structure depends on the materials used. For example, the patterns 200 of FIG. 3 may be advantageous if in an IC including copper. Devices which include copper are less heavily doped, and thus more prone to forming hillocks, bumps and extrusions when subjected to thermal cycling.

Bond pad support structures according to the invention take advantage of metal layers that are already present in IC devices. Incorporation of these structures may be accomplished by simple substitution of a mask having the patterns shown in FIG. 3 or 4 for the mask used in a conventional metal layer beneath a bond pad. The remaining steps of the semiconductor device fabrication are unaffected by incorporation of a pattern according to the invention. No additional processing steps are added to the manufacturing process.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A method of forming a bond pad support structure in an integrated circuit having a bond pad located thereon, comprising the steps of:

forming a first bond pad support layer at least partly located below the bond pad, the first bond pad support layer comprising a plurality of radial patterns with at least one space therebetween; and forming a second bond pad support layer on the first bond pad support layer, so that the second bond pad support layer fills at least a portion of the space.

2. A method according to claim 1, wherein the step of forming the plurality of radial patterns includes:

forming a first set of patterns having a first length; and forming a second set of patterns having a second length shorter than the first length, the second set of patterns including a larger number of members than the first set of patterns.

3. A method according to claim 2, wherein:

the patterns in the second set of patterns begin at a radius that is further from a point beneath the center of the bond pad than the patterns in the first set of patterns.

4. A method according to claim 3, wherein a locus of outermost points of each of the plurality of patterns lie along a polygon having at least four sides.

5. A method according to claim 1, wherein the first bond pad support layer comprises a conductive metal, and the second bond pad support layer comprises a dielectric material or a metal.

6. A method according to claim 1, wherein each of the patterns is a line segment having about the same width as each of the other line segments.

7. A method according to claim 1, wherein each of the patterns is a triangle.

8. A method according to claim 7, wherein the step of forming the plurality of triangles includes:

forming a first set of triangles, each triangle in the first set having an apex which lies within a region beneath the bond paid; and forming a second set of triangles, each triangle in the second set lying substantially outside of the region beneath the bond pad.

* * * * *